United States Patent
Tanaka et al.

(10) Patent No.: US 10,531,559 B2
(45) Date of Patent: Jan. 7, 2020

(54) ELECTRONIC DEVICE

(71) Applicant: KABUSHIKI KAISHA TOSHIBA, Minato-ku, Tokyo (JP)

(72) Inventors: Akira Tanaka, Hamura (JP); Masaya Hirashima, Yokohama (JP); Satoru Yasui, Kawasaki (JP); Shukuyo Yamada, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/805,195

(22) Filed: Nov. 7, 2017

(65) Prior Publication Data
US 2018/0359849 A1 Dec. 13, 2018

(30) Foreign Application Priority Data
Jun. 9, 2017 (JP) .................. 2017-114447

(51) Int. Cl.
*H05K 1/02* (2006.01)
*H05K 1/11* (2006.01)
*H05K 3/34* (2006.01)
*H05K 3/46* (2006.01)
*H05K 1/18* (2006.01)

(52) U.S. Cl.
CPC .......... *H05K 1/0271* (2013.01); *H05K 1/111* (2013.01); *H05K 3/34* (2013.01); *H05K 3/3442* (2013.01); *H05K 3/4697* (2013.01); *H05K 1/183* (2013.01); *H05K 2201/09036* (2013.01); *H05K 2201/09745* (2013.01); *H05K 2201/10015* (2013.01); *H05K 2201/10022* (2013.01); *H05K 2201/10166* (2013.01); *H05K 2201/2009* (2013.01); *H05K 2203/0195* (2013.01); *H05K 2203/0278* (2013.01)

(58) Field of Classification Search
CPC ..... H01L 23/36; H01L 23/13; H01L 23/3677; H01L 23/49827; H01L 21/486; H05K 1/141–144; H05K 1/181–188; H05K 1/02; H05K 1/18
USPC .......................... 361/760–772; 174/259–264
See application file for complete search history.

(56) References Cited

U.S. PATENT DOCUMENTS 5,647,122 A * 7/1997 Launay ............ G06K 19/07743
257/E21.511
5,721,454 A * 2/1998 Palmer ................ H01L 23/3677
257/700
(Continued)

FOREIGN PATENT DOCUMENTS

JP 2000-151060 5/2000
JP 2005-235997 9/2005
(Continued)

*Primary Examiner* — Tuan T Dinh
(74) *Attorney, Agent, or Firm* — Oblon, McClelland, Maier & Neustadt, L.L.P.

(57) ABSTRACT

According to one embodiment, provided are an electronic device and an electronic component protection substrate in which an electronic component is prevented from entering an irregular state. According to the electronic device of the present embodiment, an electronic component is soldered onto a pattern line of a printed circuit substrate, and a surface of the printed circuit substrate where the electronic component is disposed is formed as a recess such that the thickness of the printed circuit substrate in the recess part is thinned.

18 Claims, 9 Drawing Sheets

(56) References Cited

U.S. PATENT DOCUMENTS

| | | | | |
|---|---|---|---|---|
| 6,031,723 A * | 2/2000 | Wieloch | H01L 23/36 | 174/524 |
| 6,214,525 B1 * | 4/2001 | Boyko | H01L 21/486 | 216/18 |
| 6,531,328 B1 * | 3/2003 | Chen | H01L 24/97 | 438/106 |
| 7,868,349 B2 * | 1/2011 | Kim | H05K 3/328 | 257/100 |
| 7,894,203 B2 * | 2/2011 | Kariya | H01L 23/49827 | 361/763 |
| 8,067,695 B2 * | 11/2011 | Kaneko | H01L 23/13 | 174/250 |
| 2002/0008325 A1 * | 1/2002 | Tominaga | H01L 23/13 | 257/778 |
| 2002/0163006 A1 * | 11/2002 | Yoganandan | H01L 33/486 | 257/81 |
| 2006/0018120 A1 * | 1/2006 | Linehan | H01L 33/62 | 362/247 |
| 2006/0208271 A1 * | 9/2006 | Kim | H01L 33/486 | 257/100 |
| 2007/0090510 A1 * | 4/2007 | Tseng | H01L 33/641 | 257/690 |
| 2008/0006837 A1 * | 1/2008 | Park | H01L 33/486 | 257/98 |
| 2009/0309213 A1 * | 12/2009 | Takahashi | H01L 21/561 | 257/707 |
| 2011/0141705 A1 | 6/2011 | Takesue et al. | | |
| 2011/0284887 A1 * | 11/2011 | Wu | H01L 33/62 | 257/91 |
| 2013/0032938 A1 * | 2/2013 | Lin | H01L 23/3121 | 257/737 |

FOREIGN PATENT DOCUMENTS

| | | |
|---|---|---|
| JP | 2011-124382 | 6/2011 |
| JP | 2015-118954 | 6/2015 |
| JP | 2016-146458 | 8/2016 |

* cited by examiner

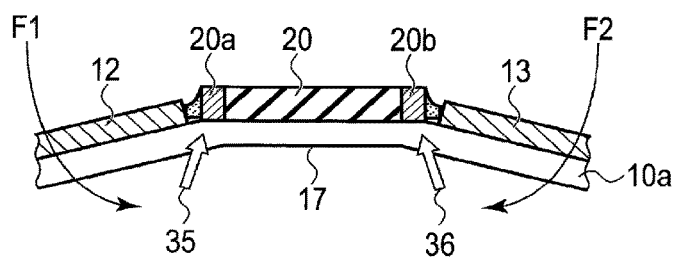
F I G. 3
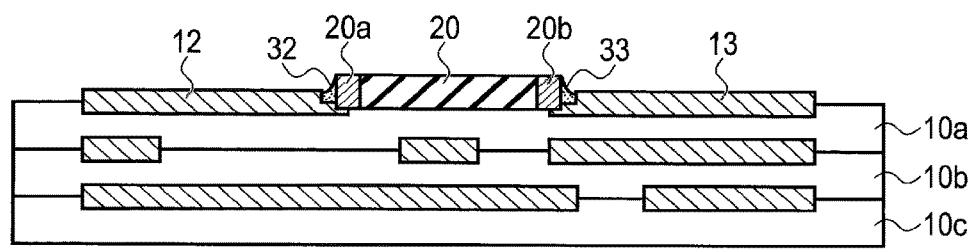
F I G. 4

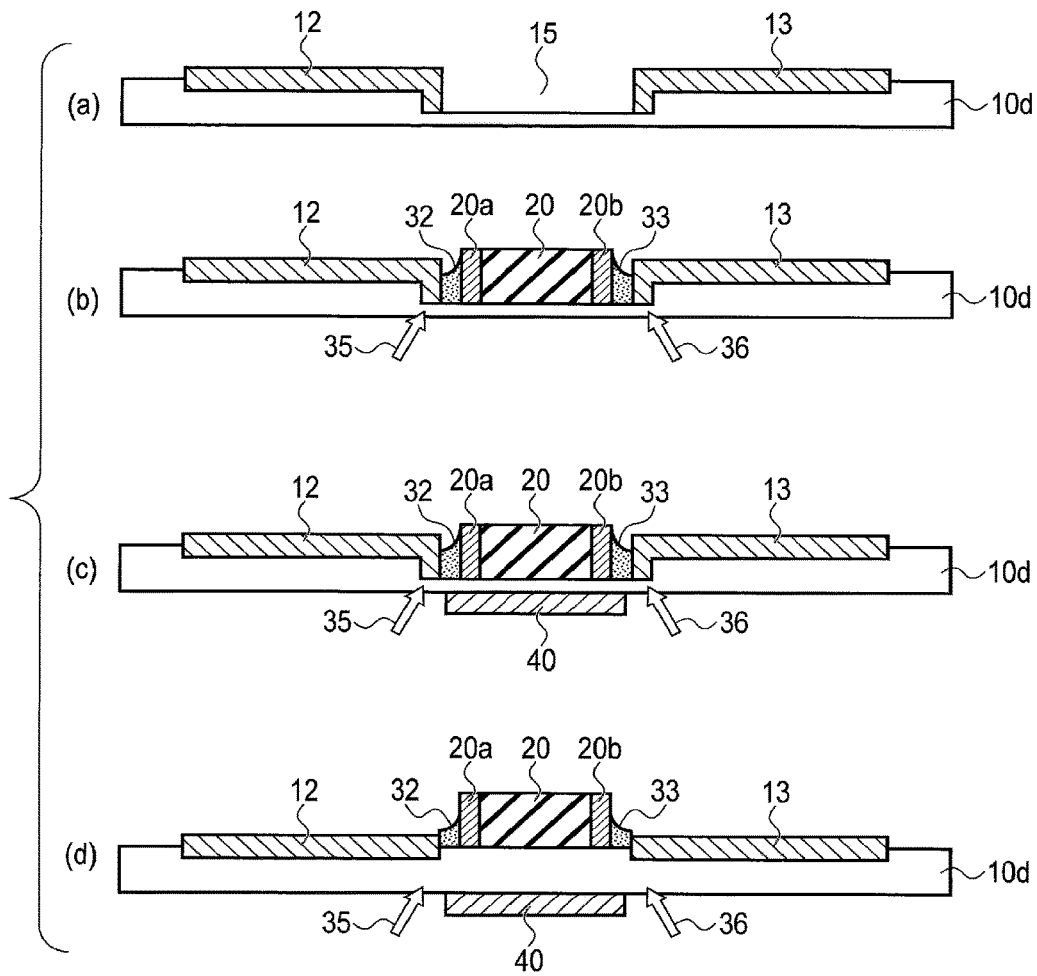
F I G. 5
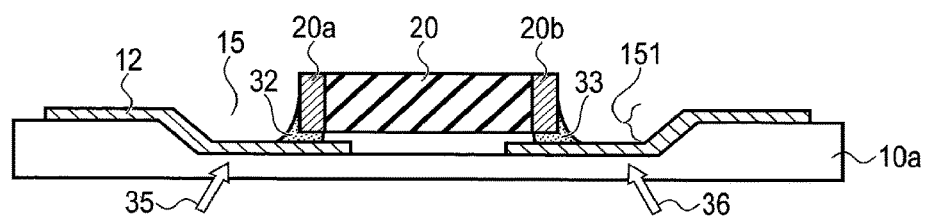
F I G. 6

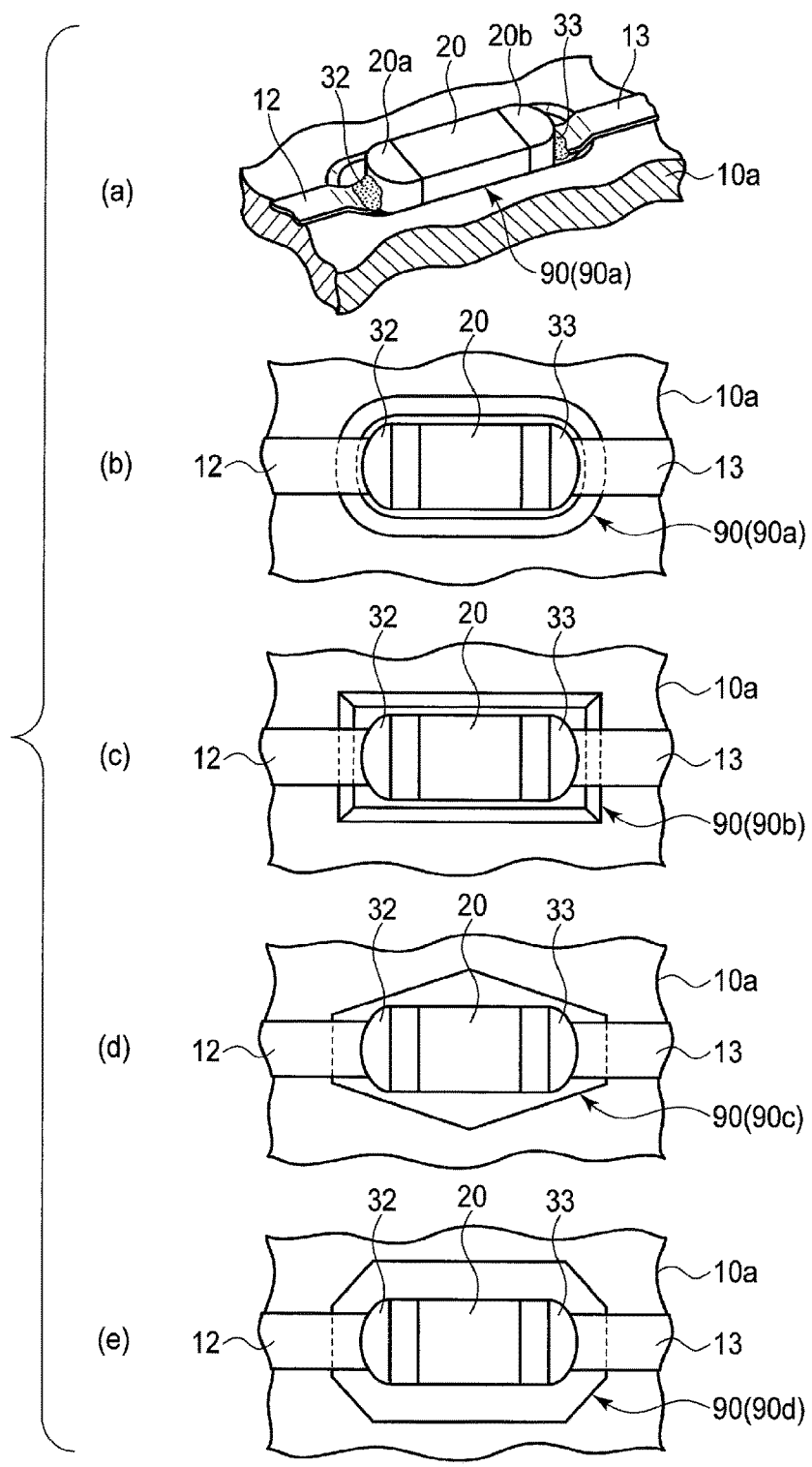
F I G. 8

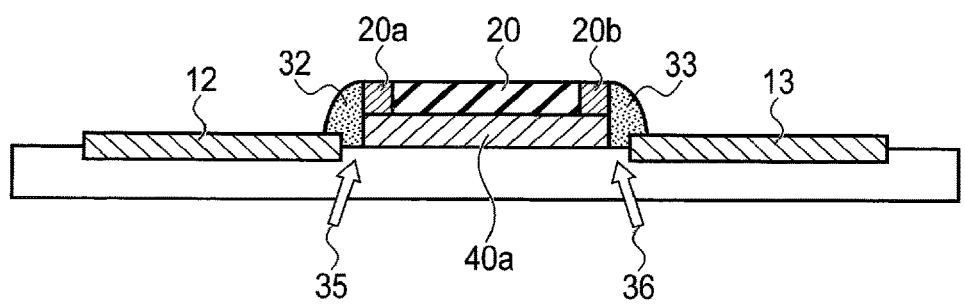
F I G. 9

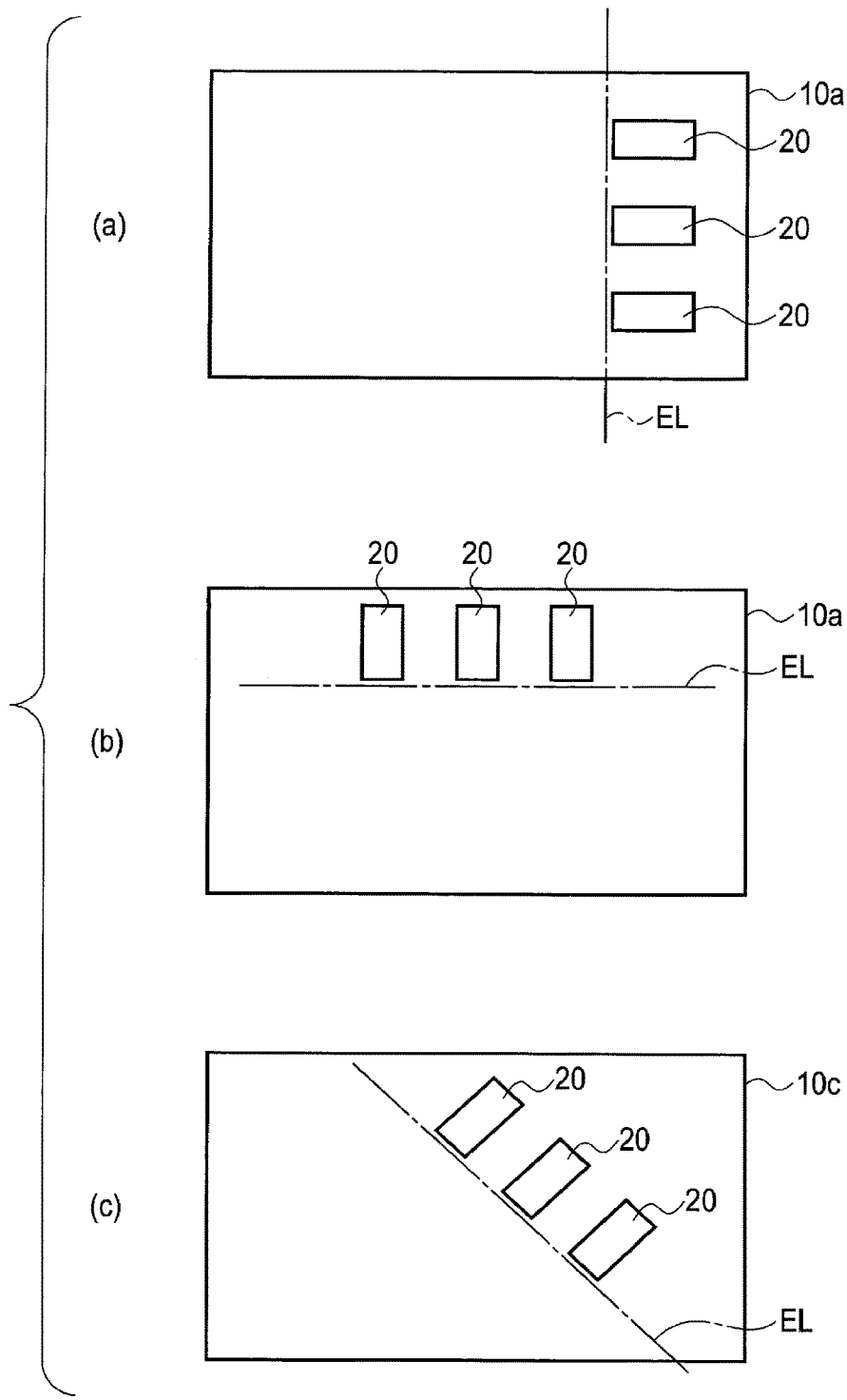
F I G. 10

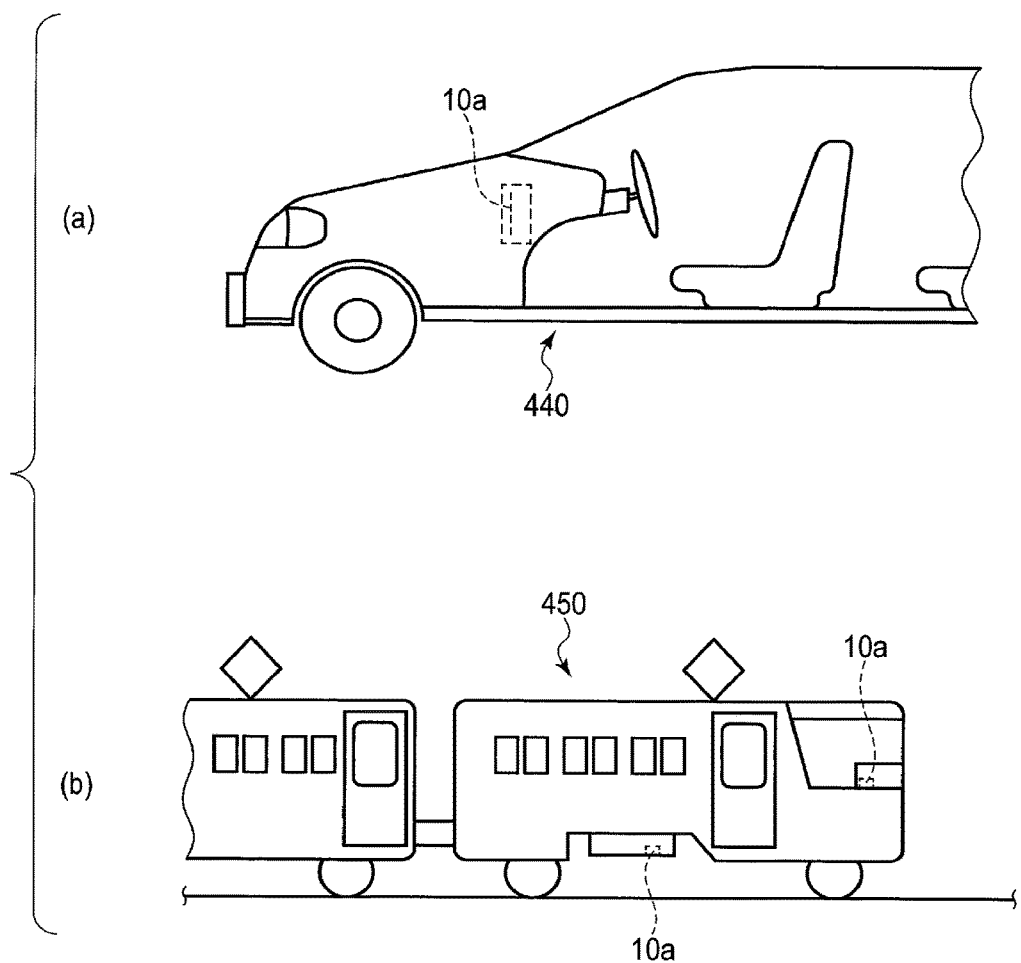
F I G. 12

ELECTRONIC DEVICE

CROSS-REFERENCE TO RELATED APPLICATIONS

This application is based upon and claims the benefit of priority from Japanese Patent Application No. 2017-114447, filed Jun. 9, 2017, the entire contents of which are incorporated herein by reference.

FIELD

Embodiments described herein relate generally to an electronic device.

BACKGROUND

In recent years, electronic devices are greatly miniaturized. Electronic devices are used in commercial, industrial, and infrastructural ways as personal computers, tablets, smartphones, gaming devices, electronic measurement devices, and the like.

The miniaturization of electronic devices is achieved because electronic components (chip parts) and printed circuit substrates used in the electronic devices are miniaturized and thinned.

Here, there is a case where an external pressure or vibration is applied to a printed circuit substrate to which electronic components are attached, and the printed circuit substrate is displaced. In that case, the pressure is applied to the electronic components mounted and fixed to the printed circuit substrate by soldering. Or, a stress is applied to the electronic components. The miniaturized electronic components are greatly affected by the external pressure and the stress, and thus, the electronic components are damaged, cracked, deformed, or twisted, and an irregular state is caused.

If the electronic components are in an irregular state, the electronic components are heated, and circuits are broken down, and in some cases, the heat causes smoke and fire and a user may be harmed. Furthermore, the electronic components may become inoperable. As examples of the electronic components, there are a ceramic condenser, resistance part, IC chip, and power transistor.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 shows a state where a stress is applied from the outside to the printed circuit substrate used in the electronic device of the embodiment.

FIG. 4 shows an example where the printed circuit substrate used in the electronic device of the embodiment is applied to a multilayer printed circuit substrate device.

FIG. 5 shows a schematic view of another example of the printed circuit substrate used in the electronic device of the embodiment.

FIG. 6 shows a schematic view of still another example of the printed circuit substrate used in the electronic device of the embodiment.

FIG. 8 shows a schematic view of still another example of the printed circuit substrate used in the electronic device of the embodiment.

FIG. 9 shows a schematic view of still another example of the printed circuit substrate used in the electronic device of the embodiment.

FIG. 10 shows an example of arrangement of electronic components as a protection target in the printed circuit substrate used in the electronic device of the embodiment.

FIG. 12 shows additional various example of the electronic devices to which the embodiment can be applied.

DETAILED DESCRIPTION

Figure 1:
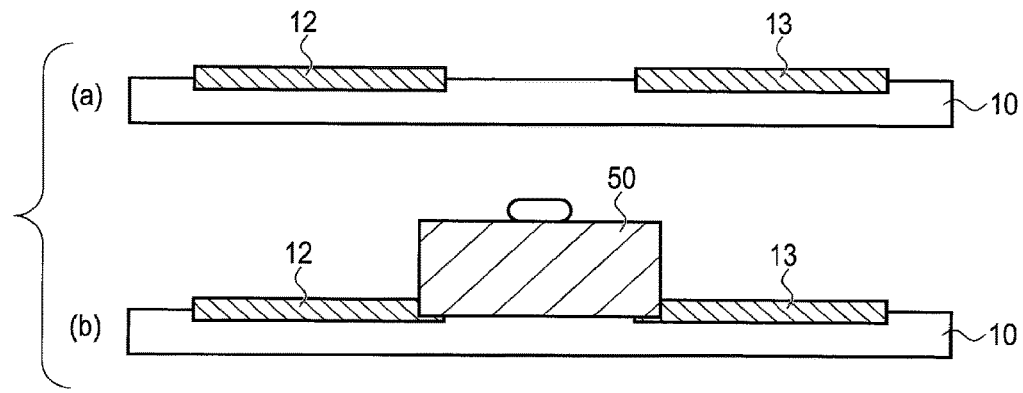
FIG. 1 shows a schematic view of treatment processes of a printed circuit substrate used in an electronic device of an embodiment.

Various embodiments will be described hereinafter with reference to the accompany drawings. Note that, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. In the specification and drawings, the structural elements having functions, which are identical or similar to the functions of the structural elements described in connection with preceding drawings, are denoted by like reference numerals, and an overlapping detailed description is omitted unless necessary.

In an embodiment, provided are an electronic device and an electronic component protection substrate in which an electronic component is prevented from entering an irregular state.

In general, according to one embodiment, an electronic component is soldered onto a pattern line of a printed circuit substrate, and a surface of the printed circuit substrate where the electronic component is disposed is formed as a recess such that the thickness of the printed circuit substrate in the recess part is thinned.

FIGS. 1(*a*) and 1(*b*) schematically show treatment processes of a printed circuit substrate used in an electronic device of an embodiment. As shown in FIG. 1(*a*), the printed circuit substrate 10 includes pattern lines 12 and 13 arranged at intervals in which an electronic component is disposed. A part between the pattern lines 12 and 13 is pressed by a pressor 50 in a thickness direction of the substrate. Thus, the part where the electronic component is disposed has a recess structure. The recess has a depth of approximately 0.1 to 1 mm. The pattern lines 12 and 13 are, for example, power line, signal line, and control line, for example. The depth of the recess is, for example, if the thickness of the substrate is 1 mm or less, approximately 0.2 mm, or may optionally be selected from 0.2 to 0.7 mm. However, no limitation is intended thereby, and the depth of the recess may be approximately 0.1 to 1 mm depending on the thickness of the substrate.

FIGS. 2(a), 2(b), and 2(c) show states where an electronic component 20 is mounted on the printed circuit substrate 10a treated as above. FIG. 2(a) shows a state where a recess 15 is formed in the printed circuit substrate 10a.

A gap (or thickness) between a bottom surface 16 of the recess 15 and a back surface 17 of the printed circuit substrate 10a is given w2. A gap between a surface 18 of the printed circuit substrate 10a and the back surface 17 is given w1, and w1>w2.

Furthermore, as compared to a state where the recess 15 is not made by the press, the area of the bottom surface 16 of the recess 15 is more rigid by the press.

FIG. 2(b) shows a state where the electronic component 20 is arranged in the recess 15. Furthermore, FIG. 2(c) shows a state where terminals 20a and 20b of the electronic component 20 and the pattern lines 12 and 13 corresponding to the terminals, respectively, are connected and fixed by solders 32 and 33.

As described above, in the present embodiment, the surface of the printed circuit substrate 10a, that is, the area where the electronic component 20 is arranged is formed as a recess 15, and the thickness of the printed circuit substrate 10a is thinned therein.

FIG. 3 shows a state where some pressure forces or stress forces F1 and F2 is applied to the printed circuit substrate 10a and the printed circuit substrate 10a is displaced. In this state, the printed circuit substrate 10a is weaker to the stress in edges 35 and 36 of the recess 15 than is in the other parts thereof. This is because the bottom part of the recess 15 increases its rigidity by the pressing process. The edges 35 and 36 of the recess 15 may be referred to as weak parts 35 and 36 of the substrate or as electronic component protection parts 35 and 36.

Therefore, deformation occurs at the edges 35 and 36 of the recess 15. That is, stress forces F1 and F2 are partly absorbed by the edges 35 and 36. From a different viewpoint, the deformation position of the printed circuit substrate 10a is shifted from the arrangement position of the electronic component 20.

Thus, affection of the stress forces F1 and F2 with respect to the electronic component 20 is reduced. As a result, as compared to conventional cases, an irregular state caused by damaged, cracked, deformed, or twisted electronic component 20 is prevented effectively.

FIG. 4 shows a case where the above printed circuit substrate 10a is applied to a multilayer printed circuit substrate device (including printed circuit substrates 10b and 10c). As depicted, the above embodiment applied to a multilayer printed circuit substrate device can prevent an above-explained irregular state of the electronic component 20.

FIGS. 5(a) to 5(d) show another examples of the printed circuit substrate, that is, a printed circuit substrate 10d used in the electronic device of the present embodiment. In the above example, the recess 15 is formed in the printed circuit substrate 10a by a pressing process. However, a recess may be formed by drilling a part of the surface of a printed circuit substrate 10d instead of the pressing process. It may be referred to as a spot facing process. FIG. 5(a) shows the printed circuit substrate 10d in which the recess 15 is formed by a spot facing process. FIG. 5(b) shows a state where an electronic component 20 is arranged in the recess 15 and terminals 20a and 20b thereof are connected and fixed to pattern lines 12 and 13 by solders 32 and 33.

In that case, the printed circuit substrate 10d is weaker to the stress in edges 35 and 36 of the recess 15 than is in the other parts thereof. Thus, the same advantages obtained in the above example are achieved as well.

FIG. 5(c) shows still another example. A bottom of the recess 15 formed by spot facing sometimes becomes weaker as compared to that of the recess formed by a pressing process. Thus, in this example, a reinforcing plate 40 is attached to the back surface of the substrate to correspond to the position of the recess 15 of the printed circuit substrate 10d. With the reinforcing plate 40, the edges 35 and 36 of the recess 15 becomes weaker than the other parts of the printed circuit substrate 10d, and the purpose of the device can be achieved effectively.

Note that the use of the reinforcing plate 40 may be varied. For example, if the back surface of the printed circuit substrate 10d includes a radio wave generator, an oscillation circuit, or the like and waves therefrom must be shielded, the reinforcing plate 40 may be used as a shield plate. Furthermore, if the printed circuit substrate 10d includes a transmitter circuit, or if a transmitter circuit is formed in a substrate (layered substrate) in the proximity of the printed circuit substrate 10d, the reinforcing plate 40 may be used as antenna element. Therefore, the reinforcing plate 40 can be used in various ways.

There are various cases where a transmitter circuit (transmitter device or transmitter circuit chip) is formed in the substrate. For example, an electronic device or a printed circuit substrate is formed integrally with or connected to a sensor, and the transmitter circuit is wirelessly connected to the Internet. That is, the printed circuit substrate may be used as a component of the Internet of Things (IoT). That is, the reinforcing plate may be used as an antenna for network connection.

Figure 2:
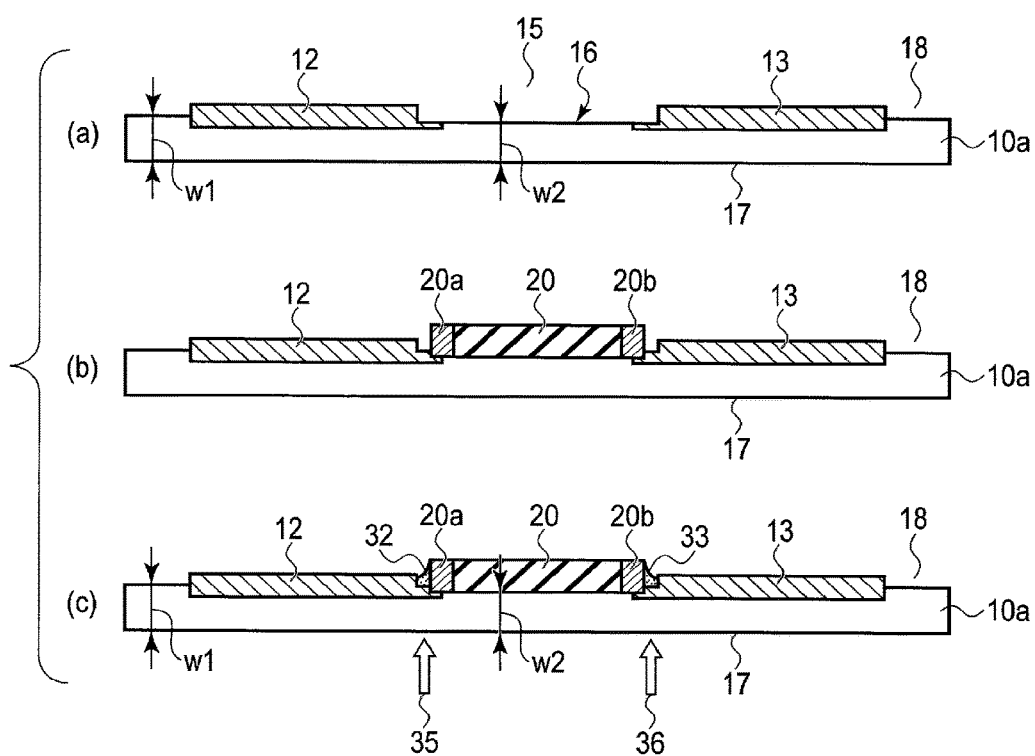
FIG. 2 shows an electronic component mounted and soldered to the printed circuit substrate after treatment in the electronic device of the embodiment.

Note that the above reinforcing plate 40 can be used in the example of FIG. 2. That is, the reinforcing plate 40 may be attached to the back surface of the printed circuit substrate 10a of FIG. 2(c) to correspond to the part of the electronic component 20. Furthermore, the reinforcing plate 40 may be used as a heat sink.

FIG. 5(d) shows still another example. In the above example of FIG. 5(c), the recess 15 is formed by a spot facing process. However, the significant structure of the present embodiment is a printed circuit substrate includes a part where an electronic component is mounted and a periphery of the part is entirely or partly structured weaker as compared to at least the bottom part of the printed circuit substrate below the electronic component. Thus, if a stress force or a deformation force is applied to the printed circuit substrate, the weaker part deforms or brakes to prevent an irregular deformation or damage to the electronic component.

Thus, as shown in FIG. 5(d), an electronic component 20 may be mounted on the printed circuit substrate 10 without forming a recess and a reinforcing plate 40 may be attached to a surface of the substrate opposite to the surface where the electronic component 20 is disposed. In that case, rigidity of the edges 35 and 36 around the electronic component 20 becomes weaker as compared to the other parts, and the purpose of the device can be achieved. In that case, as explained with reference to FIG. 5(c), the reinforcing plate 40 can be used in various ways.

FIG. 6 shows the surface of the printed circuit substrate 10a in which the area of the electronic component 20 is formed as the recess 15 where the thickness of the printed circuit substrate 10a is thinned. The printed circuit substrate 10a is formed of a material such as a resin, or a glass fiber reinforced resin.

In this example, the area of the recess 15 is formed greatly with respect to the electronic component 20, and an inclined step 151 is provided with the recess 15. Pattern lines 12 and 13 may be formed before or after the recess 15 is formed in the printed circuit substrate 10a. Even if the pattern lines 12 and 13 are formed after the formation of the recess 15, the formation of the pattern lines 12 and 13 are easily performable because of the inclined step 151. Furthermore, even if the recess 15 is formed after the formation of the pattern lines 12 and 13, breakdown of the pattern lines 12 and 13 does not easily occur because of the inclined step 151.

Figure 7:
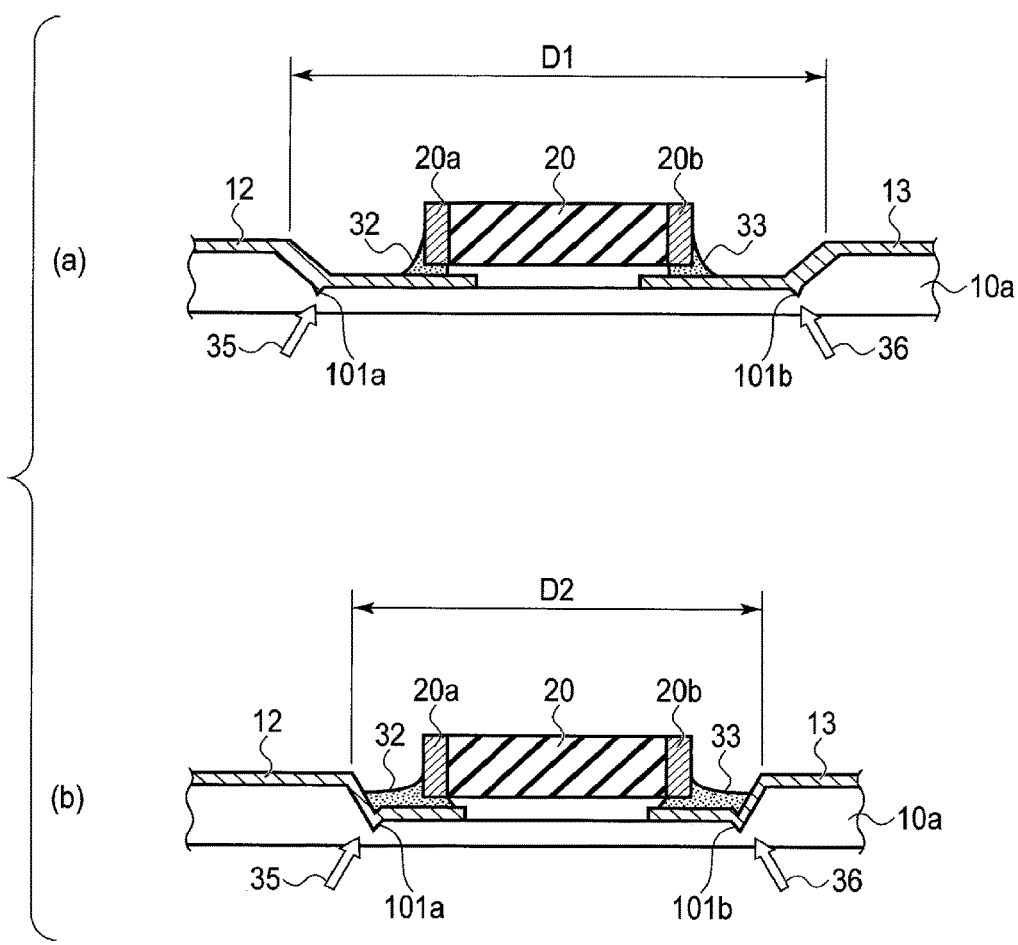
FIG. 7 shows a schematic view of still another example of the printed circuit substrate used in the electronic device of the embodiment.

FIG. 7(a) schematically shows still another example of the printed circuit substrate 10a. In this example, pattern lines 12 and 13 are formed after the formation of the recess 15 in the printed circuit substrate 10a. Note that, at the time of forming the recess 15, the mold of the presser is improved. That is, v letter shape cuts 101a and 101b, for example, are formed in the edge of the bottom of the recess 15. Thus, if a stress is applied to the printed circuit substrate 10a, the edge of the bottom of the recess 15 is easily broken (refer to FIG. 3).

FIG. 7(b) schematically shows still another example of the printed circuit substrate 10a. In this example, pattern lines 12 and 13 are formed in the printed circuit substrate 10a and then, the recess 15 is formed. That is, a presser is pressed onto the pattern lines 12 and 13 to form the recess 15. In that case, projections are provided with a mold of the presser, and cuts 101a and 101b are formed in the edge of the bottom of the recess 15.

In such a case where the presser is pressed onto the pattern lines 12 and 13 to form the recess 15, the projections of the presser may break the lines in the cuts 101a and 101b.

In consideration of the above, as compared to a length D1 of the recess 15 in the example of FIG. 7(a) (a length along the terminals 20a and 20b of the electronic component, or a length in the longitudinal direction), a length D2 of the recess 15 (a length along the terminals 20a and 20b of the electronic component, or a length in the longitudinal direction) is made shorter. With such a structure, when the terminals 20a and 20b and the pattern lines 12 and 13 are soldered, solders 32 and 33 are prevented from flowing into the cuts 101a and 101b and disconnection caused by broken lines can be avoided.

Note that the positions of cuts 101a and 101b are, in the above example, at both sides of the terminals (or in the longitudinal direction) of the electronic component; however, no limitation is intended thereby. Cuts may be provided with the entirety or an optional part of the edge of the step of the recess 15 in which the electronic component is arranged.

The recess 15 is described in cross-sectional views in the above examples. Note that the recess 15 takes various shapes in a plan view.

FIGS. 8(a) to 8(e) show various examples of shapes of recess 90 (90a, 90b, 90c, 90d, and 90e). FIG. 8(a) is a perspective view of the structure including the printed circuit substrate 10a, electronic component 20, and the like of the present embodiment. FIG. 8(b) is a perspective view of the structure of FIG. 8(a). In this example, a recess 90 (90a) is substantially an ellipse in a plan view.

In the example of FIG. 8(c), a recess 90 (90b) is a rectangle in a plan view. In the example of FIG. 8(d), a recess 90 (90c) is a rhombus or a hexagon in a plan view. In the example of FIG. 8(e), a recess 90 (90d) is an octagon in a plan view. Furthermore, although this is not shown, a recess having a circular shape in a plan view may be adopted. In some examples above, the bottom surface of the recess 90 may partly be exposed.

As described above, with the present embodiment, when a strong force is applied to the printed circuit substrate, the electronic component 20 is prevented from being damaged or displaced. The shape of the recess 90 may be a polygon in a plan view.

FIG. 9 schematically shows still another example of the printed circuit substrate used in the electronic device of the present embodiment. In the example of FIG. 5(d), the reinforcing plate 40 is attached to the substrate surface opposite to the surface where the electronic component 20 is disposed without forming a recess on the printed circuit substrate 10.

In relation thereto, FIG. 9 shows an example in which the reinforcing plate 40a forms a mound (convex part) on the surface where the electronic component 20 is disposed without forming a recess of the printed circuit substrate 10. In that case, the rigidity of the edges 35 and 36 around the electronic component 20 tends to be displaced as compared to the other parts, and the purpose of the device can be achieved effectively. That is, in a case where the chip part 20 is mounted on the convex part, a solder fillet part becomes weak. Thus, when the substrate is deformed, the solder fillet part is damaged and power is cut, and thus, a smoking incident can be prevented.

FIGS. 10(a), 10(b), and 10(c) show cases where a plurality of components 20 are mounted on a printed circuit substrate 10a. FIG. 10(a) shows electronic components 20 are arranged along a short side direction of the rectangular printed circuit substrate 10a. In some cases, electronic components 20 are ceramic condensers used for boosting. In such cases, one ends of the electronic components 20 may be arranged along the same edge line EL. This is because, when a stress is applied to the printed circuit substrate 10a, the substrate easily deforms at once along the edge line EL (refer to the weak part 35 of FIG. 3).

FIG. 10(b) shows an example in which electronic components 20 are arranged along a long side of the rectangular printed circuit substrate 10a. In that case, one ends of the electronic components 20 are arranged along the same edge line EL. This is because of the same reason of the example of FIG. 10(a).

FIG. 10(c) shows an example in which electronic components 20 are arranged along a direction crossing the long and short sides of the rectangular printed circuit substrate 10a (in a diagonal direction). In that case, one ends of the electronic components 20 are arranged along the same edge line EL. This is because of the same reason of the example of FIG. 10(a).

The above edge line EL is, preferably, selected optionally in an electronic device or other devices to which the printed circuit substrate is mounted to conform to a direction in which a stress is easily applied or vibration easily occurs.

Figure 11:
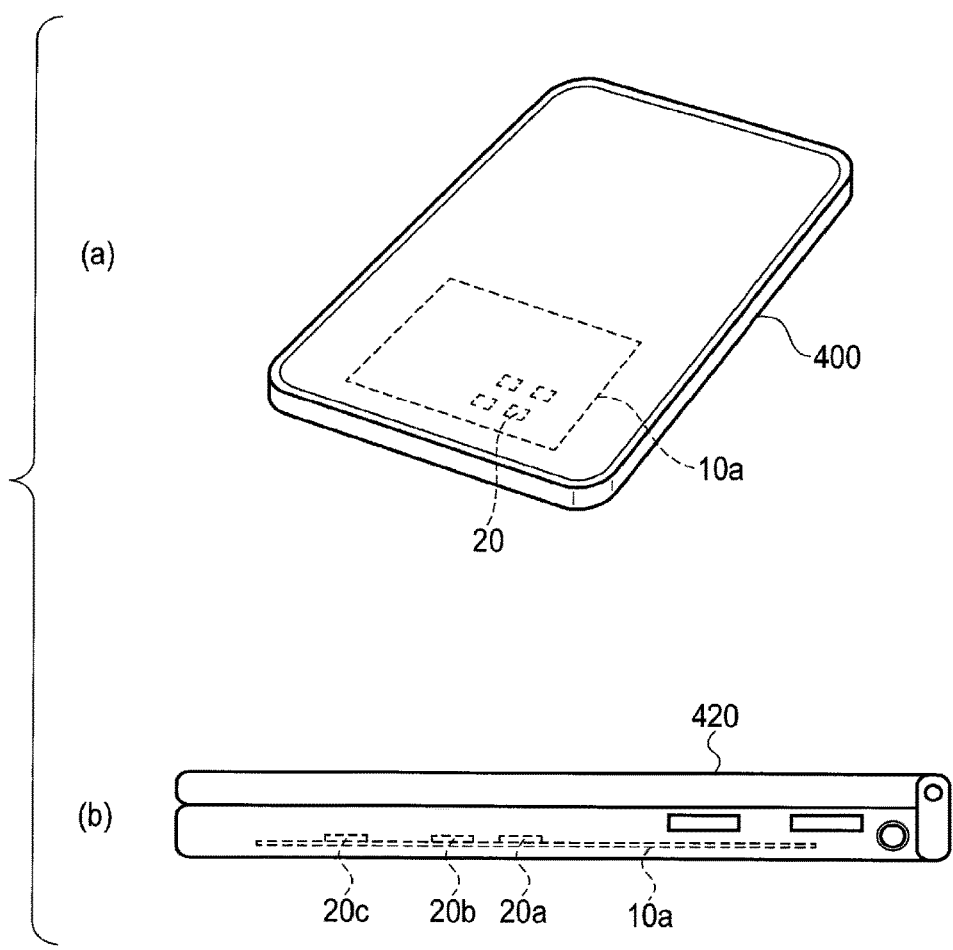
FIG. 11 shows various examples of electronic devices to which the embodiment can be applied.

FIG. 11(a) schematically shows an electronic device of the present embodiment materialized as a smartphone 400. The printed circuit substrate 10a is attached inside the smartphone 400. The electronic component 20 is mounted on the printed circuit substrate 10a.

FIG. 11(b) schematically shows an electronic device of the present embodiment materialized as a clamshell computer or a personal computer 420. The printed circuit substrate 10a is attached inside the computer 420. The electronic component 20 is mounted on the printed circuit substrate 10a.

Such mobile electronic devices may often be dropped during the use, and a stress is suddenly applied to the printed circuit substrates. In such cases, an irregular state may occur in the electronic component, and may eventually cause a heating accident without a proper care. With the structure of the present embodiment, the electronic component is protected and the accident can be prevented.

FIG. 12(a) shows an automobile to which the electronic device of the present embodiment is applied. The electronic device is disposed inside a dashboard in front of a driver seat of an automobile 440. The printed circuit substrate 10a is attached in the electronic device. The electric component 20 is mounted on the printed circuit substrate 10a.

FIG. 12(b) shows a train car 450 to which the electronic device of the present embodiment is applied. The electronic device is disposed inside a dashboard in front of a driver seat of the train car 450. And the electronic device is disposed in an inverter box of the train car 450. Then the electronic component 20 such as a power transistor is mounted on the printed circuit substrate 10a.

As described above, each electronic device including the printed circuit substrate of the present embodiment can be used in vehicles (including automobile, bus, train car, etc.) and in various mobile devices. Furthermore, the embodiment of each electronic device including the above printed circuit substrate can be rewritten as an electronic component protection substrate.

Now, basic technical concept of the above embodiment will be summarized. In the present embodiment, a chip part (for example, a chip condenser) is mounted on the surface of a substrate, and the periphery of the chip part is dented, that is, a recess is formed on the substrate (or, the chip part may be formed as a mound) such that the substrate deforms in response to a stress applied thereto before the chip part is influenced by the stress. Thus, a load to the chip part can be reduced or completely prevented.

Since the substrate is dented, the thickness in the periphery of the recess is thinned as compared to a flat surface substrate and a stress is concentrated to the periphery of the recess by the recess formed. Thus, a stress concentration point which is conventionally generated inside the chip part can be dispersed or moved and overload to the chip part can be suppressed. If a component is disposed below the substrate surface, an unnecessary contact to the other parts and members can be avoided, and a crack caused by an impact or a machine load can be prevented.

As methods of forming a recess is, for example, pressing or spot facing. When a substrate is manufactured, a chip part on an important position such as a part on a power line is preliminarily selected, and the periphery of the mount pad alone is dented by a pressing process or a spot facing process in the formation of the substrate (if a convex shape is adopted, an insulating material such as a resin, adhesive agent, or ceramic material can be used).

The recess (or convex) is formed as a cuboid, cube, truncated cone, triangular prism, isosceles trapezoid square pole, or the like by removing a part from (or adding a part to) the substrate. The removal is performed through drilling, laser removal, pressing, or chemical etching. The convex is formed by adding an insulating material.

The chip part is, unlike a conventional flat surface pad, mounted in the recess or on the convex, and solder fillet is formed in a different shape. In the recess structure, soldering can be performed in a greater area as compared to a conventional case.

Through the pressing process, the density of the substrate below the chip part can be increased, and the part below the chip part can be maintained rigidly as compared to an ordinary substrate. Thus, the resistance to deformation of the substrate increases. In the convex structure, the chip part can be reinforced by the additional material.

If the substrate is deformed while the chip part is mounted in the recess, a stress is concentrated in the periphery of the recess, and thus, a load to the soldering connection part increases as compared to a conventional case, and when the load goes too large, the soldering part is broken before the chip part is cracked. Thus, only a power failure occurs and the chip part does not generate smoke.

If the chip part is mounted on a convex, a solder fillet part becomes weak. Thus, if the substrate is deformed, the solder fillet part is broken, a power failure occurs, and the chip part does not generate smoke.

To control the deformation of the chip part, a hard material (metal, ceramics, etc.) plate or a brook may be embedded or attached to the back surface of the substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Furthermore, as to each structural element in the claims, if the structural element is divided in different terms, or if some structural elements are gathered as a term or combined into a term, such cases are covered by the scope of the inventions of the present application. Furthermore, some embodiments can be combined. Furthermore, if a claim is written as a control logic, or if a claim is written as a program including an instruction to execute a computer, or if a claim is written as a computer readable recording medium containing the instruction, such cases are covered by the scope of the inventions of the present application. Furthermore, names and terms used in the application are not limited thereto, and different expressions can be used if the contents and concepts of the present application are maintained.

Furthermore, a combination of some of the embodiments or a combination of any parts of different embodiments would fall within the scope and spirit of the inventions.

What is claimed is:

1. An electronic device comprising:
   an electronic component soldered onto a pattern line of a printed circuit substrate, wherein a surface of the printed circuit substrate where the electronic component is disposed is formed as a recess such that the thickness of the printed circuit substrate in the recess is reduced,
   wherein from the surface of the printed circuit substrate to an edge of a bottom of the recess a step surface is provided formed in a direction of the thickness of the printed circuit substrate, and
   from the surface of the printed circuit substrate to the edge of the bottom, the pattern line is provided on the step surface,
   a terminal of the electronic component faces the step surface, and a gap is formed between the terminal and the step surface, and
   solder is provided in the gap and connects the pattern line on the step surface and the terminal of the electronic component;
   wherein a non-recessed part is dented by a pressing process and the bottom of the recess in the printed circuit substrate is harder than is a non-recessed part, and a reinforcing plate is attached to a surface opposite to the surface where the recess in the printed circuit substrate is formed.

2. The electronic device of claim 1, wherein a non-recessed part is dented by a spot facing process, and the recess is formed.

3. The electronic device of claim 1, wherein a non-recessed part is dented by a spot facing process or a pressing process, and the reinforcing plate is an antenna.

4. The electronic device of claim 1, wherein a cut in the thickness direction of the printed circuit substrate is formed in the edge of the bottom of the recess.

5. The electronic device of claim 1, wherein a non-recessed part is dented by a spot facing process or a pressing process, and in a plan view of the side of the recess, the shape of the recess is an ellipse or a polygon.

6. The electronic device of claim 1, wherein the printed circuit substrate including the recess is used in an automobile.

7. The electronic device of claim 1, wherein the printed circuit substrate including the recess is used in a train car.

8. The electronic device of claim 1, wherein the printed circuit substrate including the recess is used in a mobile device.

9. The electronic device of claim 1, wherein a non-recessed part is dented by a spot facing process or a pressing process, and the reinforcing plate is a heat sink.

10. The electronic device of claim 1, wherein a non-recessed part is dented by a spot facing process or a pressing process, and the reinforcing plate is a heat sink, and the electronic component is one of a ceramic condenser, resistance part, IC chip, and power transistor.

11. The electronic device of claim 1, wherein a non-recessed part is dented by a spot facing process or a pressing process, and the reinforcing plate is an antenna, and the electronic component is a power transistor.

12. The electronic device of claim 1, wherein a non-recessed part is dented by a spot facing process or a pressing process, and the printed circuit substrate is one component of the Internet of Things.

13. The electronic device of claim 1, wherein a non-recessed part is dented by a spot facing process or a pressing process, and the printed circuit substrate is one component of the Internet of Things.

14. The electronic device of claim 1, wherein a non-recessed part is dented by a spot facing process or a pressing process, and the printed circuit substrate is one component of the Internet of Things, and the reinforcing plate is an antenna.

15. The electronic device of claim 1, wherein a cut in the thickness direction of the printed circuit substrate is formed in the edge of the bottom and is buried with a part of the pattern line.

16. The electronic device of claim 14, wherein the printed circuit substrate mounts a transmitter circuit.

17. The electronic device of claim 16, wherein the printed circuit substrate is mounted on an automobile.

18. The electronic device of claim 16, wherein the printed circuit substrate is mounted on a train.

* * * * *